United States Patent
Lin et al.

(10) Patent No.: US 9,899,246 B2
(45) Date of Patent: Feb. 20, 2018

(54) GAS DISTRIBUTOR USED IN WAFER CARRIERS

(71) Applicant: GUDENG PRECISION INDUSTRIAL CO., LTD, New Taipei (TW)

(72) Inventors: Chin-Ming Lin, New Taipei (TW); Ming-Chien Chiu, New Taipei (TW); Jui-Ken Kao, New Taipei (TW); Chen-Hao Chang, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 121 days.

(21) Appl. No.: 14/735,126

(22) Filed: Jun. 9, 2015

(65) Prior Publication Data
US 2015/0357218 A1 Dec. 10, 2015

(30) Foreign Application Priority Data
Jun. 9, 2014 (TW) .............................. 103210143 U

(51) Int. Cl.
*B65B 3/04* (2006.01)
*H01L 21/673* (2006.01)

(52) U.S. Cl.
CPC . *H01L 21/67393* (2013.01); *Y10T 137/86212* (2015.04)

(58) Field of Classification Search
CPC ......... H01L 21/67393; H01L 21/67017; H01L 21/67303; H01L 21/67028; H01L 21/673
USPC .......................................................... 137/573
See application file for complete search history.

(56) References Cited

U.S. PATENT DOCUMENTS

| | | | | |
|---|---|---|---|---|
| 5,217,053 A * | 6/1993 | Foster | ............... | H01L 21/67393 141/286 |
| 6,758,876 B2 * | 7/2004 | Suzuki | ............... | H01L 21/67017 206/710 |
| 2011/0210041 A1* | 9/2011 | Okabe | ............... | H01L 21/67393 206/710 |
| 2012/0297981 A1* | 11/2012 | Burns | ............... | H01L 21/67376 95/273 |

* cited by examiner

*Primary Examiner* — Craig Schneider
*Assistant Examiner* — Angelisa L Hicks
(74) *Attorney, Agent, or Firm* — Cheng-Ju Chiang

(57) ABSTRACT

The present invention relates to gas distributors used in wafer carriers. The gas distributors comprise a body having an interior space, a separator configured at the front side of the body in the interior space, and an air inlet connected with the body. One edge of the separator and the front side of the body together form a passage. The configuration of the passage in the gas distributors enables the gas distributors to evenly distribute gases.

3 Claims, 3 Drawing Sheets

US 9,899,246 B2

GAS DISTRIBUTOR USED IN WAFER CARRIERS

TECHNICAL FIELD

At least one embodiment of the present invention relates to apparatuses used in FOUPs to purge the interior space. More particularly, the apparatuses are to evenly distribute purge gases.

DESCRIPTION OF THE RELATED ART

Electronic components recently have been developed into nanoscale. In such advanced manufacturing, particles from environments show significant impact on electronic components and may damage the stability of electronic components. In order to prevent the contamination of particles from environments and the subsequent damages to components, wafers are usually preserved in wafer carriers for handling, transportation, and storage. One of the wafer carriers is a front opening unified pod (FOUP).

Conventional FOUPs usually comprises a pod having an opening, a door configured on the opening, and a holder configured in the pod used for holding multiple wafers in parallel. For the purpose of maintaining the interior space of a pod in cleanness, the pod is required to be purged regularly. Thus, a pod usually contains air ports for the routine purging process. Furthermore, for the purpose of maintaining the wafer in low humidity, a pod usually contains a gas distributor, having multiple air outlets lining from the bottom side to the top side of the pod, in the interior space to evenly distribute purge gases. However, how to effectively distribute gases into the pod is still a problem.

Conventionally, a FOUP usually contains two air inlets and two air outlets configured on the bottom side of the pod. And to purge such a FOUP, purge gas is supplied from the two air inlets on the bottom of the FOUP. The purge gas supplied into the FOUP will firstly repel the air and the moisture in the interior space of the pod around the two air inlets to the two air outlets. In order to purge the interior space away from the two air inlets, high volume of purge gases is needed to fill into the pod. Accordingly, a pod filled with more purge gas to mix and replace the air and the moisture shows a higher degree of cleanness; and a pod filled with less purge gases to mix and replace shows a lower degree of cleanness. Another FOUP, comprising three air inlets and one air outlet, has been proposed to accelerate the mixing of the air and the moisture and improve the purge efficiency. However, both FOUPs can be purged only when no wafer is inside. Therefore, both FOUPs are not suitable for dehumidifying wafers.

In order to purge a FOUP with wafers inside, the purge gas supplied to the FOUP is required to be evenly distributed. One conventional FOUP comprises a tubular apparatus configured in the FOUP and connected with the air inlet to control the gas distribution. The tubular apparatus comprises multiple slits exposing to the interior space of the FOUP. One or two of the tubular apparatus may be configured at the corners or departments and connected with the purge port of the FOUP. Some of the tubular apparatuses further comprise a filter. Some of the tubular apparatuses or purge ports further comprise a check valve to control the moving direction of airflow in the FOUP and provide airtight connections between the tubular apparatuses and the purge ports. The tubular apparatus here is to transport purge gases to the top side of the pod to provide the purge gases to clean the pod. However, since the purge gas are supplied from the air inlet at the bottom side of the pod, the airflow at the lower part of the pod is still much higher than that of the higher part of the pod and result in low uniformity of gas distribution.

The aforementioned FOUPs utilizing the configuration of air inlets and air outlets on the bottom side of the pod to mix gases or utilizing tubular apparatus to transport purge gases to the top side of the pod are still unable to evenly distribute purge gases inside the pod. Especially when the FOUPs are full of wafers because of that the wafers would hinder the airflow and disturb the gas distribution inside the FOUPs. Accordingly, the regulation of humidity in the conventional FOUPs is ineffective.

SUMMARY

At least one embodiment of the present invention is to provide a gas distributor used in wafer carriers. The gas distributor used in wafer carriers is able to evenly distribute gas in front opening unified pods (FOUPs).

At least one embodiment of the present invention is to provide a gas distributor used in wafer carriers. The gas distributor used in wafer carriers comprises a first room and a second room. And gas provided to the gas distributor used in wafer carriers will evenly diffuse from the first room to the second room.

At least one embodiment of the present invention is to provide a FOUP. The FOUP comprises a pod and a gas distributor, in which the gas distributor is configured at the rear side of the FOUP.

At least one embodiment of the present invention provides a gas distributor used in wafer carriers. The gas distributor used in wafer carriers comprises a body having an interior space and a separator configured in the interior space. One edge of the separator and the front side of the body together form a passage. Moreover, the separator divides the interior space into a first room and a second room. The first room is connected with an air inlet, in which the air inlet is under the body and the passage. And the second room is connected with at least one air outlet, in which the at least one air outlet is configured at the front side of the body.

In some embodiments, the separator further comprises an extended member, in which the extended member extends into the first room.

In some embodiments, the extended member has a surface which is facing the front side of the body. And the distance between the surface and the separator is greater at an end away from the air inlet.

In some embodiments, the extended member has at least one surface facing the front side of the body. The at least one surface comprises a first part and a second part, in which the width of the second part is larger than that of the first part.

In some embodiments, the first part is the part closer to the air inlet while the second part is the part away from the air inlet. More particularly, the width of the first part is constant but the width of the second part is greater at an end away from the air inlet.

In some embodiments, a FOUP is provided. The FOUP comprises a pod and a gas distributor used in wafer carriers, in which the gas distributor used in wafer carriers is configured at the rear side of the pod.

DESCRIPTION OF THE PREFERRED EMBODIMENTS

The examples depicted in the following section are provided for the purpose of detailed explanation of the features of preferred embodiments, in order to enable one having ordinary skill in the art to understand the preferred embodiments.

Figure 1A:
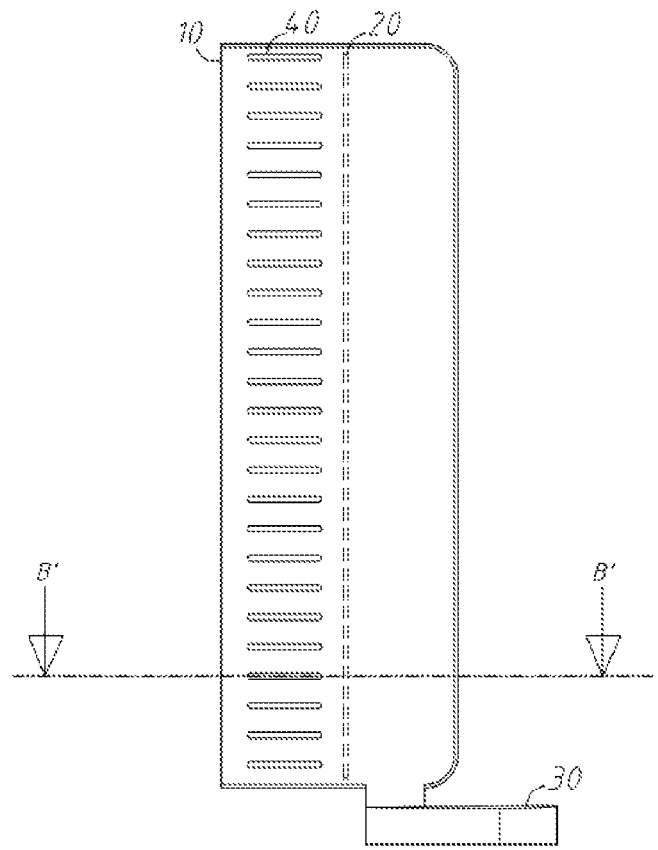
FIG. 1A is a schematic diagram illustrating a gas distributor used in wafer carriers, according to one preferred embodiment of the present invention.

FIG. 1A is a schematic diagram illustrating a gas distributor used in wafer carriers, according to one preferred embodiment of the present invention. The gas distributor used in wafer carriers comprises a body 10, a separator 20, a first room 101, an air inlet 30, a second room 102, and at least one air outlet 40.

Figure 1B:
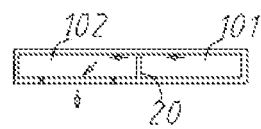
FIG. 1B is a cross-sectional view of the gas distributor used in wafer carriers in FIG. 1A, taken on the section line B'-B'.

FIG. 1B is a cross-sectional view of the gas distributor used in wafer carriers, taken on the section line B'-B' in FIG. 1A. The body comprises an interior space and a separator 20 configured in the interior space. One edge of the separator 20 and the front side of the body 10 together form a passage. Moreover, the separator 20 divides the interior space into a first room 101 and a second room 102. The first room 101 is connected with an air inlet 30, in which the air inlet 30 is under the body 10 and the passage. In contrast, the second room 102 is connected with at least one air outlet 40, in which the at least one air outlet 40 is configured on the front side of the body 10.

The purge gas supplied to the gas distributor used in wafer carriers enters the first room 101 through the air inlet 30. The first room 101 and the second room 102 are connected by the passage, and the control over the airflow from the first room 101 to the second 102 is based in part on the passage. The passage improve the filling efficiency of the purge gas from the bottom side to the top side but suppress the diffusion rate of the purge gas from the first room 101 to the second room 102 via the passage. Thus, the passage mitigates the unbalanced airflows (e.g., the airflow at the top side and the airflow at the bottom side) from the first room 101 to the second room 102.

Figure 2A:
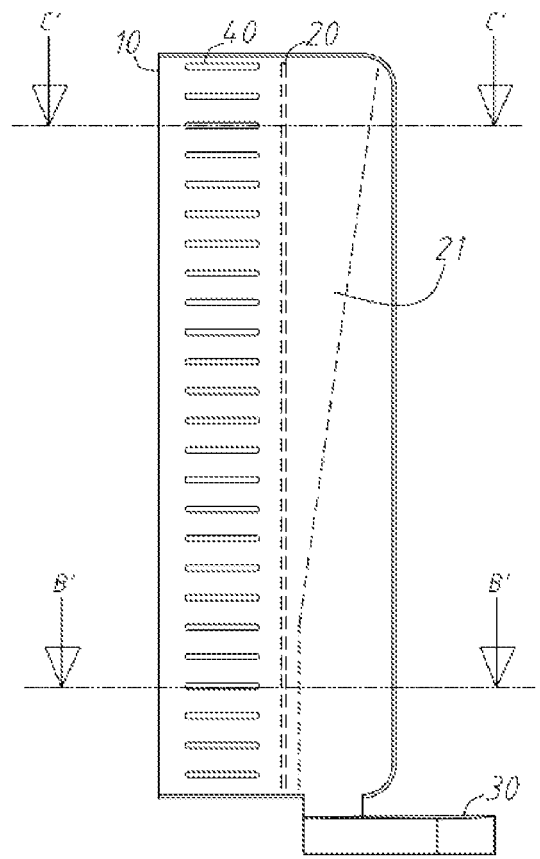
FIG. 2A is a schematic diagram illustrating a gas distributor used in wafer carriers, according to one preferred embodiment of the present invention.

FIG. 2A is a schematic diagram illustrating a gas distributor used in wafer carriers, according to one preferred embodiment of the present invention. The separator 20 is configured in the interior space of the body 10 and, with the front side of the body 10, forms a passage. The separator 20 in FIG. 2A comprises an extended member 21, in which the extended member 21 extends into the first room 101. The extended member 21 is to elongate the width of the passage to further mitigate the unbalanced airflows from the first room 101 to the second room 102.

Figures 2B, 2C:
FIG. 2B is a cross-sectional view of the gas distributor used in wafer carriers in FIG. 2A, taken on the section line B'-B'.
FIG. 2C is a cross-sectional view of the gas distributor used in wafer carriers in FIG. 2A, taken on the section line C'-C'.

FIG. 2B and 2C are cross-sectional views of the gas distributor used in wafer carriers, taken on the section line B'-B' and second line C'-C' in FIG. 2A respectively. The separator 20 comprises an extended member 21 extending into the first room 101. The extended member 21 has at least one surface facing the front side of the body 10, in which the at least one surface further comprises a first part 211 and a second part 212. The first part 211 is the part closer to the air inlet 30 while the second part 212 is the part away from the air inlet 30. The first part 211 and the second part 212 of the extended member 21 have differences in width and thus further enhance the uniformity of gas distribution from the first room 101 to the second room 102.

According to one preferred embodiment of the present invention, the width of the first part 211 of the extended member 21 is constant but the width of the second part 212 is increasing to the end away from the air inlet 30. The first part 211 and the second part 212 of the extended member 21 generate different path lengths of the passage between the first room 101 and the second room 102. More particularly, the width of the at least one surface, on the extended member 21, facing the front side of the body 10 is defined as the path length of the passage. Of the extended member 21, the end closer to the air inlet 30 has a shorter path length since the width of the first part 211 of the at least one surface, facing the front side of the body 10, on the extended member 21 is smaller. Thus, the purge gas flowing into the second room 102 from the end closer to air inlet 30 is regulated under a shorter path length of the passage. On the other hand, the end away from the air inlet 30 has a longer path length since the width of the second part 212 of the at least one surface, facing the front side of the body 10, on the extended member 21 is greater. Thus, the purge gas in the first room 101 flowing toward the end away from the air inlet 30 is regulated under an increasing path length of the passage. The varied path length of the passage control the distribution and the airflow of the purge gas at the end close to the air inlet 30 and the end away from the air inlet 30. The control by the passage may evenly distribute gases from the second room 102 to wafer carriers through the air outlet 40.

Figure 3:
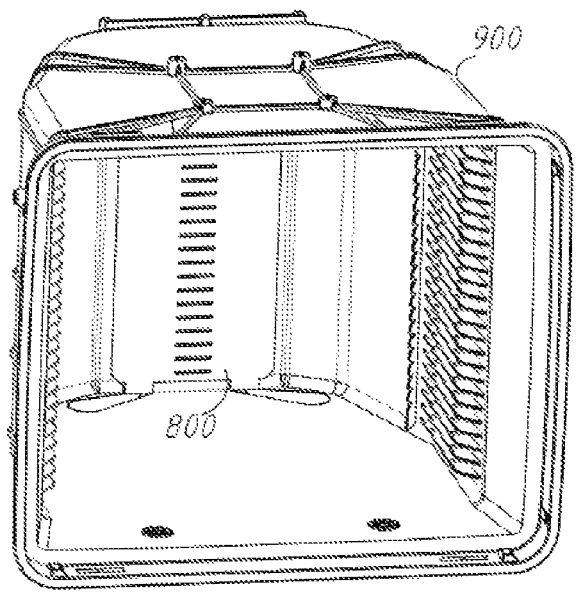
FIG. 3 is a schematic diagram illustrating a front opening unified pod (FOUP), according to one preferred embodiment of the present invention.

FIG. 3 is a schematic diagram illustrating a front opening unified pod (FOUP), according to one preferred embodiment of the present invention. The FOUP comprises a pod 900 and a gas distributor used in wafer carriers 800 as in the previous embodiments. The gas distributor used in wafer carriers 800 is configured at the back side of the pod 900. More particularly, the gas distributor used in wafer carriers 800 comprises a body having an interior space and a separator configured in the interior space. One edge of the separator and the front side of the body together form a passage, and the separator further divides the interior space into a first room and a second room. The first room is connected with an air inlet, in which the air inlet is under the body and the passage. In contrast, the second room is connected with at least one air outlet, in which the at least one air outlet is configured on the front side of the body. The passage is to control the airflow from the first room to the second room. The purge gas supplied to the air inlet fills the pod 900 through the air outlet of the gas distributor used in wafer carriers. After passing through the gas distributor used in wafer carriers, the airflow at the top side and the bottom side in the pod 900 is in higher uniformity. Accordingly, even in a pod 900 containing multiple wafers, the wafers, from the top side to the bottom side, can be more equally purged.

At least one embodiment of the present invention provides a gas distributor used in wafer carriers. The gas distributor used in wafer carriers comprises a body having an interior space, in which is to distribute purge gas into a FOUP. An air inlet is connecting with the body to supply purge gas into the body. A separator is configured in the interior space and, with the front side of the pod, forms a passage. There are a first room and a second room, in which the bottom side of the first room is connecting with the air inlet and the second room is connecting with multiple air outlets. Moreover, the separator comprises an extended member. Of the extended member, the end closer to the air inlet has a shorter passage and the end away from the air inlet has a longer passage. The configuration of the extended member is to control and regulate the airflow from the first room to the second room to mitigate the problem that the gas distribution at the top side and the bottom side is uneven.

There are many inventions described and illustrated above. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

What is claimed is:

1. A gas distributor used in wafer carriers, comprising:
a body having an interior space, wherein the interior space comprises a front side and a back side;
a separator being configured in the interior space, wherein the separator comprises a first edge and a second edge, the first edge is connected with the front side of the interior space and the second edge reaches the back side of the interior space, forming a passage;
wherein the separator divides the interior space into:
a first room connected with an air inlet, wherein the air inlet is configured in a bottom of the first room; and
a second room connected with at least one air outlet, wherein the at least one air outlet is configured on the front side of the interior space;
wherein the separator further comprises an extended member which is connected with the second edge of the separator, and the extended member is parallel to the back side of an interior space in the first room; wherein the extended member has a first end and a second end; wherein the first end is located at the bottom of the first room, and the second end is located on top of the first room;
wherein a first width of the extended member between the first end of the extended member and the second edge of the separator is smaller than a second width of the extended member between the second end of the extended member and the second edge of the separator.

2. A gas distributor used in wafer carriers, comprising:
a body having an interior space, wherein the interior space comprises a front side and a back side;
a separator being configured in the interior space, wherein the separator comprises a first edge and a second edge, the first edge is connected with the front side of the interior space and the second edge reaches the back side of the interior space, forming a passage;
wherein the separator divides the interior space into:
a first room connected with an air inlet, wherein the air inlet is configured in a bottom of the first room; and
a second room connected with at least one air outlet, wherein the at least one air outlet is configured on the front side of the interior space;
wherein the separator further comprises an extended member which is connected with the second edge of the separator, and the extended member is parallel to the back side of an interior space in the first room;
wherein the extended member has at least one surface facing the front side of the interior space in the first room, and wherein the at least one surface comprises a first part and a second part having a width larger than that of the first part.

3. The gas distributor used in wafer carriers as claimed in claim 2, wherein the width of the first part is constant and the width of the second part is greater at an end away from the air inlet.

* * * * *